US010643989B2

(12) United States Patent
Wang et al.

(10) Patent No.: US 10,643,989 B2
(45) Date of Patent: May 5, 2020

(54) ELECTROSTATIC DISCHARGE PROTECTION APPARATUS HAVING AT LEAST ONE JUNCTION AND METHOD FOR OPERATING THE SAME

(71) Applicant: MACRONIX INTERNATIONAL CO., LTD., Hsinchu (TW)

(72) Inventors: Shih-Yu Wang, Taipei (TW); Ming-Yin Lee, Hsinchu (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 0 days.

(21) Appl. No.: 16/057,872

(22) Filed: Aug. 8, 2018

(65) Prior Publication Data
US 2020/0051970 A1 Feb. 13, 2020

(51) Int. Cl.
*H01L 29/72* (2006.01)
*H01L 27/02* (2006.01)

(52) U.S. Cl.
CPC .................. *H01L 27/0262* (2013.01)

(58) Field of Classification Search
None
See application file for complete search history.

(56) References Cited

U.S. PATENT DOCUMENTS

| 6,768,619 | B2* | 7/2004 | Ker | H01L 27/0262 257/355 |
| 8,390,070 | B2* | 3/2013 | Chen | H01L 27/0262 257/141 |
| 8,885,305 | B2 | 11/2014 | Shan et al. | |
| 8,896,024 | B1* | 11/2014 | Chen | H01L 27/0262 257/173 |
| 2012/0104459 | A1* | 5/2012 | Huang | H01L 27/0262 257/173 |

FOREIGN PATENT DOCUMENTS

TW 201345101 A 11/2013

* cited by examiner

*Primary Examiner* — Hung K Vu
(74) *Attorney, Agent, or Firm* — McClure, Qualey & Rodack, LLP

(57) ABSTRACT

An ESD protection apparatus includes a semiconductor substrate, a first well, a second well, a first doping region, a second doping region, a third doping region, a fourth doping region and at least one junction formed by different conductivities. The first well and the second well respectively having a first conductivity and a second conductivity are disposed in the semiconductor substrate. The first doping region having the first conductivity is disposed in the first well. The second doping region having the second conductivity is disposed in the first well. The third doping region and the fourth doping region respectively having the first conductivity and the second conductivity are disposed in the second well. The at least one junction is formed by the first doping region and the second doping region, or formed by the third doping region and the fourth doping region.

17 Claims, 4 Drawing Sheets

ELECTROSTATIC DISCHARGE PROTECTION APPARATUS HAVING AT LEAST ONE JUNCTION AND METHOD FOR OPERATING THE SAME

BACKGROUND

Technical Field

The disclosure in generally relates to a semiconductor integrated circuit (IC) and the applications thereof, and more particularly to an electrostatic discharge (ESD) protection apparatus and a method for operating the same.

Description of the Related Art

An ESD event commonly results from the discharge of a high voltage potential and leads to pulses of high current in a short duration (typically, 100 nanoseconds). Semiconductor IC is vulnerable to ESD events resulted by human contact with the leads of the IC or electrically charged machinery being discharged in other leads of the IC. Accordingly, an ESD protection circuit is essential to a semiconductor IC.

A parasitic silicon controlled rectifier (SCR) is one kind of on-chip semiconductor ESD protection device. Due to its high current sinking/sourcing capability, very low turn-on impedance, low power dissipation, and large physical volume for heat dissipating, parasitic lateral SCR devices have been recognized in the prior art as one of the most effective elements in semiconductor ESD protection circuits.

However, there is a major disadvantage with using the parasitic SCR in ESD protection circuits, the parasitic SCR has a holding voltage far less than its trigger voltage. Once the parasitic SCR is triggered under a high-voltage operation, electrical overstress (EOS) or latch up risk may occur during a subsequent normal operation.

Therefore, there is a need of providing an improved ESD protection apparatus and a method for operating the same to obviate the drawbacks encountered from the prior art.

SUMMARY

One aspect of the present disclosure is to provide an ESD protection apparatus, wherein the ESD protection apparatus includes a semiconductor substrate, a first well, a second well, a first doping region, a second doping region, a third doping region and at least one junction formed by different conductivities. The first well and the second well respectively having a first conductivity and a second conductivity are disposed in the semiconductor substrate. The first doping region having the first conductivity is disposed in the first well. The second doping region having the second is disposed in the first well. The third doping region and the fourth doping region respectively having the first conductivity and the second conductivity are disposed in the second well. The at least one junction is formed by the first doping region and the second doping region, or formed by the third doping region and the fourth doping region.

Another aspect of the present disclosure is to provide a method for operating an ESD protection apparatus including steps as follows: Firstly an ESD protection apparatus is provided to electrically connecting with an internal circuit. The ESD protection apparatus includes a semiconductor substrate, a first well, a second well, a first doping region, a second doping region, a third doping region and at least one junction formed by different conductivities. The first well and the second well respectively having a first conductivity and a second conductivity are disposed in the semiconductor substrate. The first doping region having the first conductivity is disposed in the first well. The second doping region having the second is disposed in the first well. The third doping region and the fourth doping region respectively having the first conductivity and the second conductivity are disposed in the second well. The at least one junction is formed by the first doping region and the second doping region, or formed by the third doping region and the fourth doping region. When the internal circuit is subjected to an ESD stress, the ESD current is directed to a ground by the ESD protection apparatus through the at least one junction.

In accordance with the aforementioned embodiments of the present disclosure, an ESD protection apparatus and a method for operating the ESD protection apparatus. The ESD protection apparatus includes at least four doping regions respectively disposed in two doping wells having different conductivities, and at least one junction formed by different conductivities is formed by the first doping region and the second doping region, or formed by the third doping region and the fourth doping region. One of the doping regions is used to form the anode (or the cathode). The ESD protection apparatus is connected to an internal circuit. When the internal circuit is subjected to an ESD stress, the ESD current is directed to a ground by the ESD protection apparatus through the at least one junction. Thereby, the effective resistance of the ESD protection apparatus can be elevated, the holding voltage of the ESD protection apparatus can also be increased, and the EOS or latch up risk can be moderated.

BRIEF DESCRIPTION OF THE DRAWINGS

The above objects and advantages of the present disclosure will become more readily apparent to those ordinarily skilled in the art after reviewing the following detailed description and accompanying drawings, in which.

DETAILED DESCRIPTION

Figure 1:
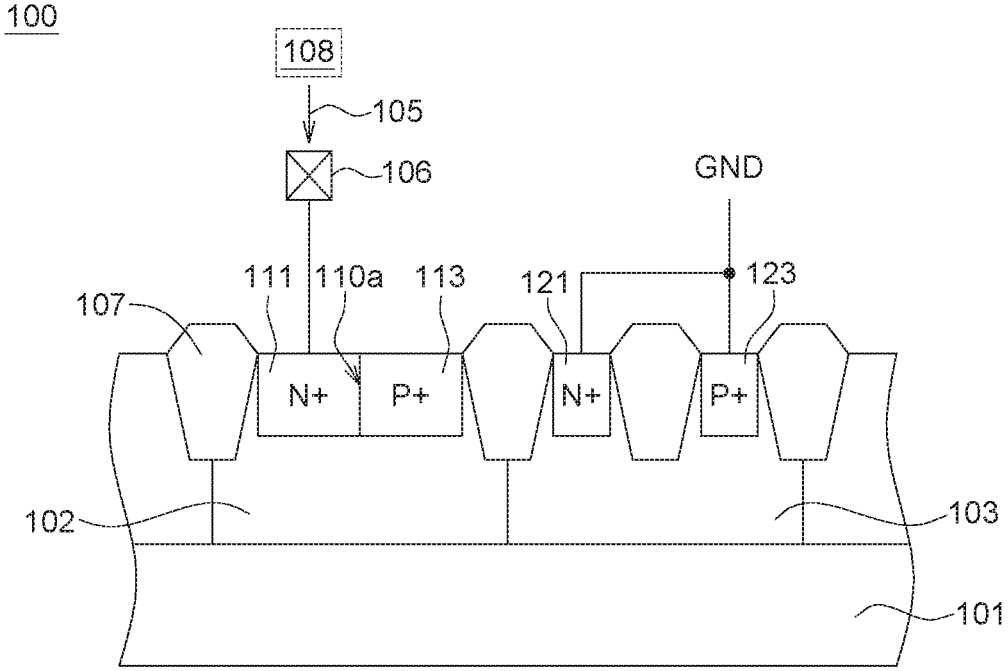
FIG. 1 is a cross-sectional view of an ESD protection apparatus in accordance with one embodiment of the present disclosure.

The embodiments as illustrated below provide an ESD protection apparatus and applications thereof to moderate the EOS or latch up risk of a parasitic SCR involved in the ESD protection apparatus. The present disclosure will now be described more specifically with reference to the following embodiments illustrating the structure and arrangements thereof.

It is to be noted that the following descriptions of preferred embodiments of this invention are presented herein for purpose of illustration and description only. It is not intended to be exhaustive or to be limited to the precise form disclosed. Also, it is also important to point out that there may be other features, elements, steps and parameters for implementing the embodiments of the present disclosure which are not specifically illustrated. Thus, the specification and the drawings are to be regard as an illustrative sense rather than a restrictive sense. Various modifications and similar arrangements may be provided by the persons skilled in the art within the spirit and scope of the present disclosure. In addition, the illustrations may not be necessarily be drawn to scale, and the identical/similar elements of the embodiments are designated with the same/similar reference numerals.

FIG. 1 is a cross-sectional view of the ESD protection apparatus 100 in accordance with one embodiment of the present disclosure. The ESD protection apparatus 100 includes a semiconductor substrate 101, a first well 102, a second well 103, a first doping region 111, a second doping region 113, a third doping region 121 and a fourth doping region 123.

In some embodiments of the present disclosure, the semiconductor substrate 101 can be made of semiconductor materials (such as silicon (Si), germanium (Ge), and so on), compound semiconductor materials (such as silicon carbide (SiC), gallium arsenide (GaAs), iodine phosphide (IP), phosphide (GaP), iodine arsenide (lAs) and/or iodine antimony (ISb)). In the present embodiment, the substrate 101 can be a P-substrate having a doping well (the first well 102) with n-type conductivity and a doping well (the second well 103) with p-type conductivity.

The first doping region 111 having n-type conductivity is disposed in the first well 102 and has a doping concentration substantially greater than that of the first smell 102 (also referred to as N+), The second doping region 113 having p-type conductivity is disposed in the first well 102 and has a doping concentration substantially greater than that of the first well 102 (also referred to as P+). For example, the first doping region 111 and the second doping region 113 may have a doping concentration of $10^{15}/cm^2$, respectively. The first well 102 may have a doping concentration of $10^{13}/cm^2$.

The first doping region 111 is connected to a voltage source 105 through a pad 106. During a normal operation (the operation voltage is about 2V), a voltage may be imposed on the first doping region 111 by the voltage source 105. Some isolations 107 are disposed in the ESD protection apparatus 100 to implement its electrical isolation function.

The third doping region 121 having n-type conductivity is disposed in the second well 103 and has a doping concentration substantially greater than that of the second well 103 (also referred to as N+). The fourth doping region 123 having p-type conductivity is disposed in the second well 103 and has a doping concentration substantially greater than that of the second well 103 (also referred to as P+). For example, the third doping region 121 and the fourth doping region 123 may have a doping concentration of 1015/cm2, respectively. The second well 103 may have a doping concentration of 1013/cm2. The third doping region 121 and the fourth doping region 123 are connected to the ground (referred to as GND).

The first doping region 111, the third doping region 121 and the fourth doping region 123 may be connected to the pad 106 and the ground GND through metal lines, respectively. No metal line is connected to the second doping region 113. That is, the second doping region 113 is in a floating state. The first doping region 111 and the second doping region 113 are directly connected and contacting together to form a P+/N+ junction (p-n junction 110a) therebetween.

The second doping region 113, the first well 102 and the second well 103 are integrated to form a PNP parasitic BJT having p-type majority carriers. The first well 102, the third doping region 121 and the second well 103 are integrated to form an NPN parasitic BJT having n-type majority carriers. The collector of the PNP parasitic BJT is connected to the base of the NPN parasitic BJT. The base of the PNP parasitic BJT is connected to the collector of the NPN parasitic BJT, whereby a parasitic SCR is formed in the semiconductor substrate 101. The second doping region 113 may serve as the anode of the parasitic SCR, and the third doping region 121 may serve as the cathode of the parasitic SCR within the ESD protection apparatus 100.

In some embodiments, the ESD protection apparatus 100 having the parasite SCR may be electrically connected to an internal circuit 108. When the internal circuit 108 is subjected to an ESD stress, the ESD current can flow into the ESD protection apparatus 100 from the pad 106 through the first doping region 111, and be directed to the ground GND through the p-n junction 110a and the third doping region 121. In some embodiments, when the internal circuit 108 is subjected to an ESD stress, a junction between the first well 102 and the second well 103 may breakdown and generate holes and electrons flowing to the cathode and the anode, respectively, and then the parasite SCR turns on. Since the second doping region 113 is floating, the ESD current flows into the ESD protection apparatus 100 having the parasite SCR from the pad 106 and passes through the first doping region 111. Then, the ESD current tunnels to the second doping region 113 from the first doping region 111 by penetrating the p-n junction 110a, and then flows to the third doping region 121 and is directed into the ground GND via the third doping region 121.

Since one P+/N+ junction (p-n junction 110a) is formed by the first doping region 111 and the second doping region 113 disposed between the anode and the cathode, the effective path is lengthened comparing to a comparative example having no p-n junction formed by the doping regions, thus the holding voltage of the parasitic SCR in the ESD protection apparatus can be significantly increased. As a result, the EOS or latch up risk can be moderated.

In some embodiments, the ESD protection apparatus 100 is used to protect an internal circuit 108 involved in a memory device from being damaged by ESD current, and the internal circuit 108 can be a memory cell array, wherein the internal circuit 108 is electrically connected to the pad 106 of the parasitic SCR of the ESD protection apparatus 100.

Figure 2:
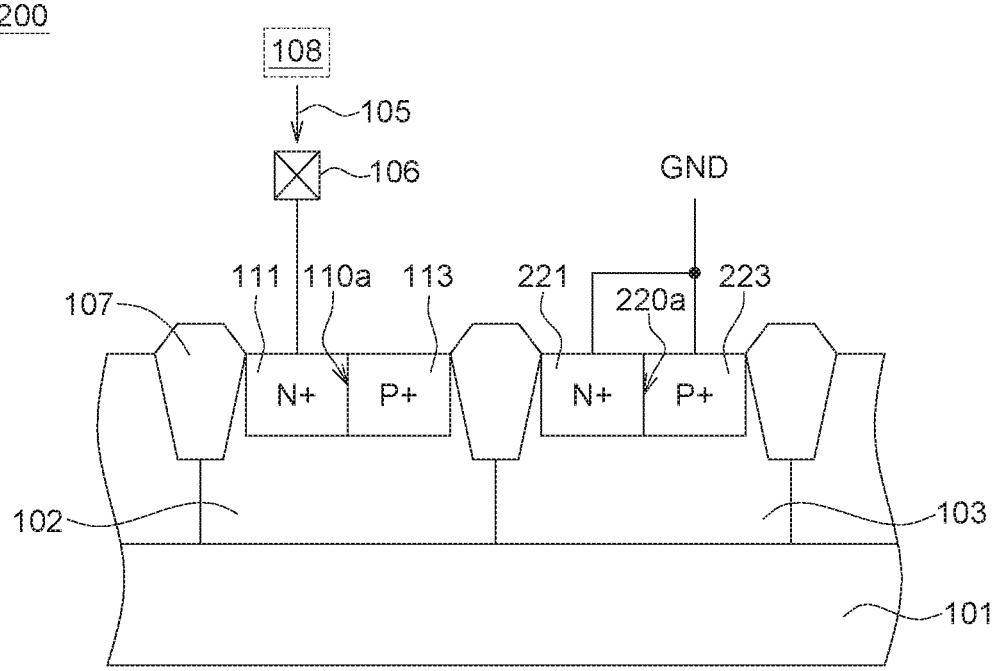
FIG. 2 is a cross-sectional view of an ESD protection apparatus in accordance with another embodiment of the present disclosure.

FIG. 2 is a cross-sectional view illustrating an ESD protection apparatus 200 in accordance with another embodiment of the present disclosure. The structure of the ESD protection apparatus 200 is similar to that of the ESD protection apparatus 100 depicted in FIG. 1, except that the third doping region 221 and the fourth doping region 223 are connected and contacting together to form another p-n junction 220a. The third doping region 221 and the fourth doping region 223 are similar to the third doping region 121 and the fourth doping region 123.

In the ESD protection apparatus 200, two P+/N+ junctions are formed by the first doping region 111 and the second doping region 113 (p-n junction 110a), and formed by the third doping region 121 and the fourth doping region 123 (p-n junction 220a). Both of the third doping region 221 and the fourth doping region 223 are electrically connected to the ground by, for example, metal lines.

When the internal circuit 108 is subjected to an ESD stress, the second doping region 113 may be remained in a floating state, the ESD current flows into the ESD protection apparatus 200 having the parasite SCR from the pad 106 and passes through the first doping region 111. Then, the ESD current tunnels to the second doping region 113 from the first doping region 111 by penetrating the p-n junction 110a, and then flows to the third doping region 221 and is directed into the ground GND via the third doping region 221.

Since the P+/N+ junction (p-n junction 110a) is formed in the ESD protection apparatus (ESD protection apparatus 200), the effective path between the anode and the cathode is lengthened comparing to a comparative example having no p-n junction formed by the doping regions, thus the holding voltage of the parasitic SCR in the ESD protection apparatus can be significantly increased. As a result, the EOS or latch up risk can be moderated.

Figure 3:
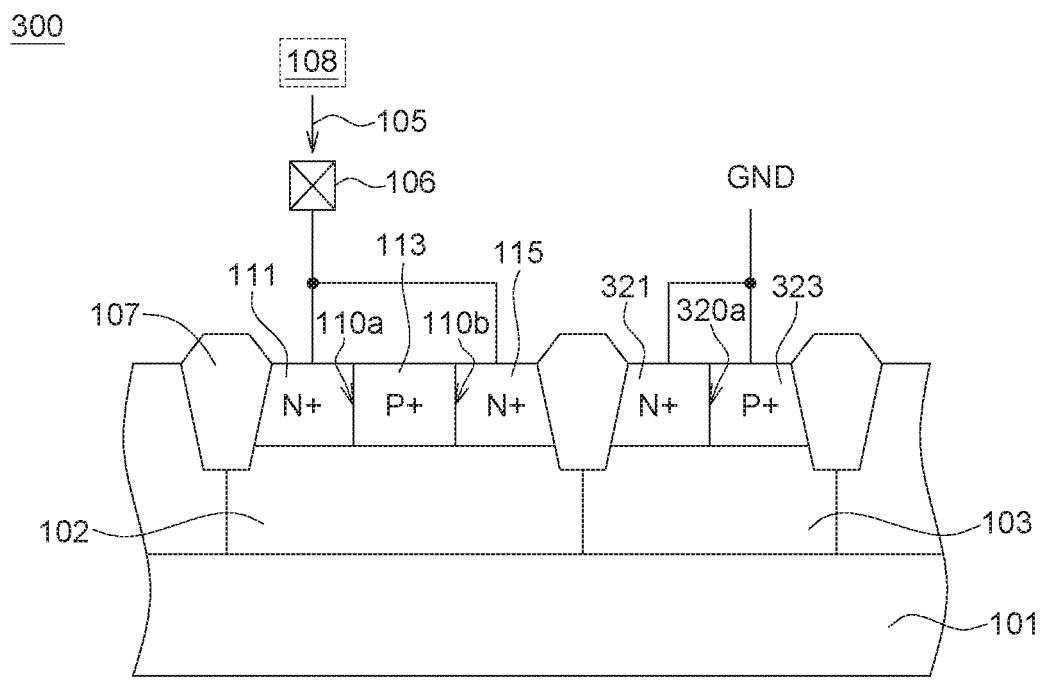
FIG. 3 is a cross-sectional view of an ESD protection apparatus in accordance with a further embodiment of the present disclosure.

FIG. 3 is a cross-sectional view illustrating an ESD protection apparatus 300 in accordance with yet another embodiment of the present disclosure. The structure of the ESD protection apparatus 300 is similar to that of the ESD protection apparatus 100 depicted in FIG. 1, except that a fifth doping region 115 is disposed in the first well 102 and connected to the second doping region 113 to form another p-n junction 110b, and the third doping region 321 and the fourth doping region 323 are connected and contacting together to form yet another p-n junction 320a. The fifth doping region 115 having n-type conductivity has a doping concentration substantially greater than that of the first well 102 (also referred to as N+). For example, the fifth doping region 115 may have a doping concentration of $10^{15}/cm^2$. The third doping region 321 and the fourth doping region 323 are similar to the third doping region 121 and the fourth doping region 123, respectively.

In the ESD protection apparatus 300, three P+/N+ junctions are formed by the first doping region 111 and the second doping region 113 (p-n junction 110a), formed by the second doping region 113 and the fifth doping region 115 (p-n junction 110b), and formed by the third doping region 321 and the fourth doping region 323 (p-n junction 320a). No metal line is connected to the second doping region 113, and the second doping region 113 is in a floating state. Both of the first doping region 111 and the fifth doping region 115 are electrically connected to the pad 106 by, for example, metal lines. Both of the third doping region 321 and the fourth doping region 323 are electrically connected to the ground GND by, for example, metal lines.

When the internal circuit 108 is subjected to an ESD stress, the second doping region 113 may be remained in a floating state, the ESD current flows into the ESD protection apparatus 300 having the parasite SCR from the pad 106 and passes through the first doping region 111 and the fifth doping region 115. Then, the ESD current tunnels to the second doping region 113 from the first doping region 111 and the fifth doping region 115 by respectively penetrating the p-n junction 110a and the p-n junction 110b, and then flows to the third doping region 321 and is directed into the ground GND via the third doping region 321.

Since P+/N+ junctions (p-n junctions 110a and 110b) are formed in the ESD protection apparatus (ESD protection apparatus 300), the effective path between the anode and the cathode is lengthened comparing to a comparative example having no p-n junction formed by the doping regions, thus the holding voltage of the parasitic SCR in the ESD protection apparatus can be significantly increased. As a result, the EOS or latch up risk can be moderated.

Figure 4:
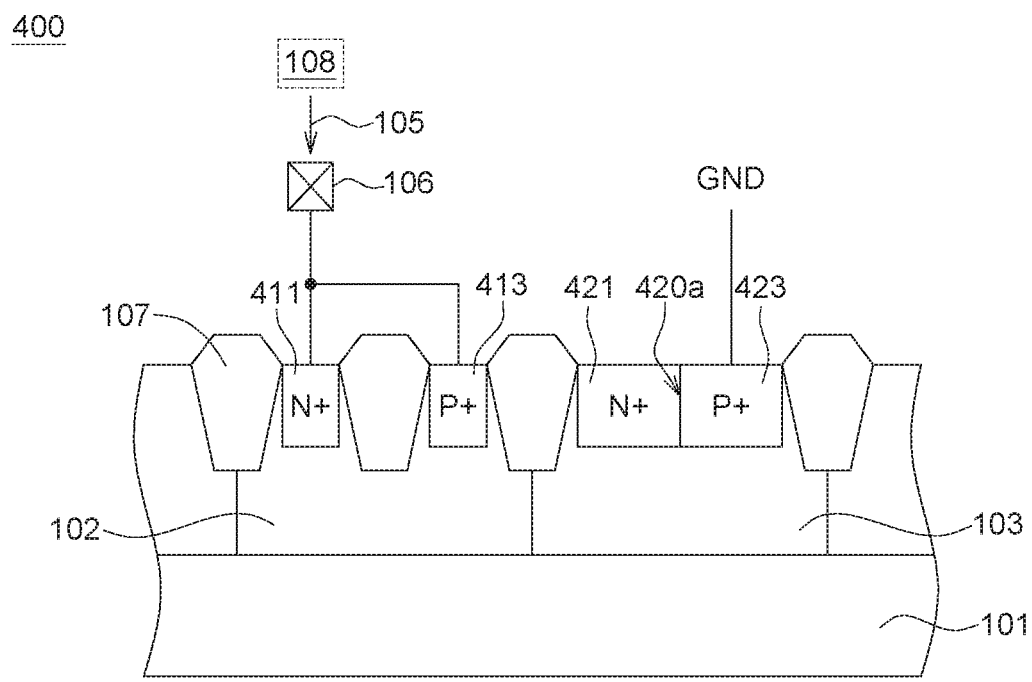
FIG. 4 is a cross-sectional view of an ESD protection apparatus in accordance with a further embodiment of the present disclosure.

FIG. 4 is a cross-sectional view illustrating an ESD protection apparatus 400 in accordance with a further embodiment of the present disclosure. The structure of the ESD protection apparatus 400 is similar to that of the ESD protection apparatus 100 depicted in FIG. 1, except that the first doping region 411 and the second doping region 413 are separated by the isolation 107, and third doping region 421 and the fourth doping region 423 are connected and contacting together to form a p-n junction 420a. No metal lines may be connected to the third doping region 421, and the third doping region 421 may be in a floating state. Both of the first doping region 411 and the second doping region 413 are electrically connected to the pad 106 by, for example, metal lines. The fourth doping region 423 is electrically connected to the ground GND by, for example, a metal line. The first doping region 411, the second doping region 413, the third doping region 421 and the fourth doping region 423 are similar to the first doping region 111, the second doping region 113, the third doping region 121 and the fourth doping region 123, respectively.

In the ESD protection apparatus 400, one P+/N+ junction is formed by third doping region 421 and the fourth doping region 423 (p-n junction 420a).

When the internal circuit 108 is subjected to an ESD stress, the ESD current flows into the ESD protection apparatus 400 having the parasite SCR from the pad 106 and passes through the second doping region 413, and flows to the third doping region 421. The third doping region 421 may be remained in a floating state. Then, the ESD current tunnels to the fourth doping region 423 from the third doping region 421 by penetrating the p-n junction 420a, and then is directed into the ground GND via the fourth doping region 423.

Since the P+/N+ junction (p-n junction 420a) is formed in the ESD protection apparatus (ESD protection apparatus 400), the effective path between the anode and the cathode is lengthened comparing to a comparative example having no p-n junction formed by the doping regions, thus the holding voltage of the parasitic SCR in the ESD protection apparatus can be significantly increased. As a result, the EOS or latch up risk can be moderated.

Figure 5:
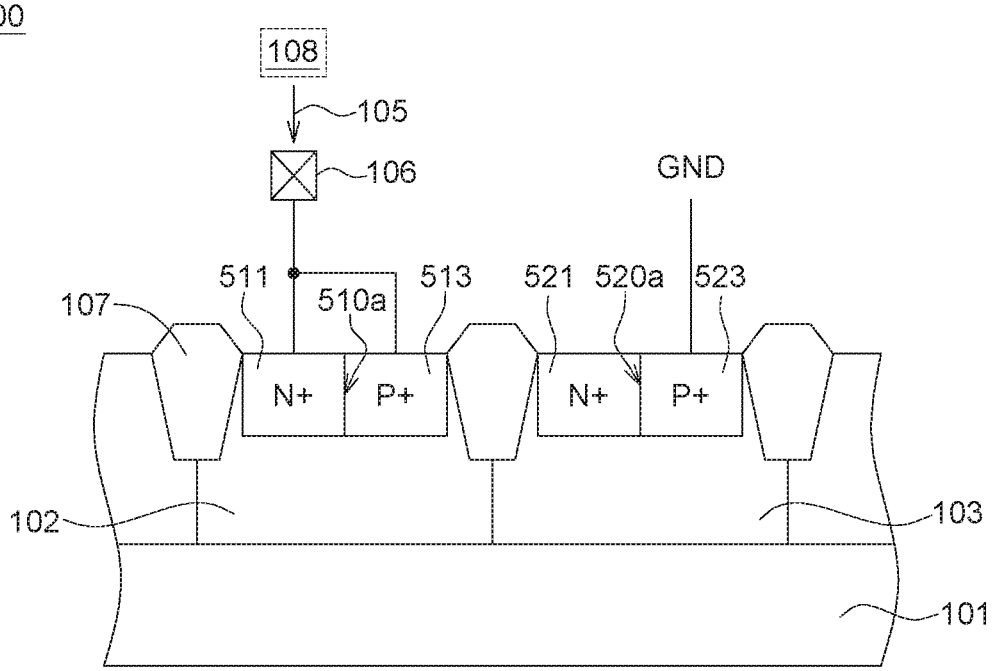
FIG. 5 is a cross-sectional view of an ESD protection apparatus in accordance with a further embodiment of the present disclosure.

FIG. 5 is a cross-sectional view illustrating an ESD protection apparatus 500 in accordance with a further embodiment of the present disclosure. The structure of the ESD protection apparatus 500 is similar to that of the ESD protection apparatus 100 depicted in FIG. 1, except that the third doping region 221 and the fourth doping region 223 are connected and contacting together to form another p-n junction 220a. Both of the first doping region 511 and the second doping region 513 are electrically connected to the pad 106 by, for example, metal lines. No metal line is connected to the third doping region 521 and the third doping region 521 is in a floating state. The fourth doping region 523 is electrically connected to the ground GND by, for example, metal lines. The first doping region 511, the second doping region 513, the third doping region 521 and the fourth doping region 523 are similar to the first doping region 111, the second doping region 113, the third doping region 121 and the fourth doping region 123, respectively.

In the ESD protection apparatus 500, two P+/N+ junctions are formed by the first doping region 511 and the second doping region 513 (p-n junction 510a), and formed by the third doping region 521 and the fourth doping region 523 (p-n junction 520a).

When the internal circuit 108 is subjected to an ESD stress, the ESD current flows into the ESD protection apparatus 500 having the parasite SCR from the pad 106 and passes through the second doping region 513, and then flows to the third doping region 521. Then, the ESD current tunnels to the fourth doping region 523 from the third doping region 521 by penetrating the p-n junction 520a, and is directed into the ground GND via the fourth doping region 523.

Since the P+/N+ junction (p-n junction 520a) is formed in the ESD protection apparatus (ESD protection apparatus 500), the effective path between the anode and the cathode is lengthened comparing to a comparative example having no p-n junction formed by the doping regions, thus the holding voltage of the parasitic SCR in the ESD protection apparatus can be significantly increased. As a result, the EOS or latch up risk can be moderated.

Figure 6:
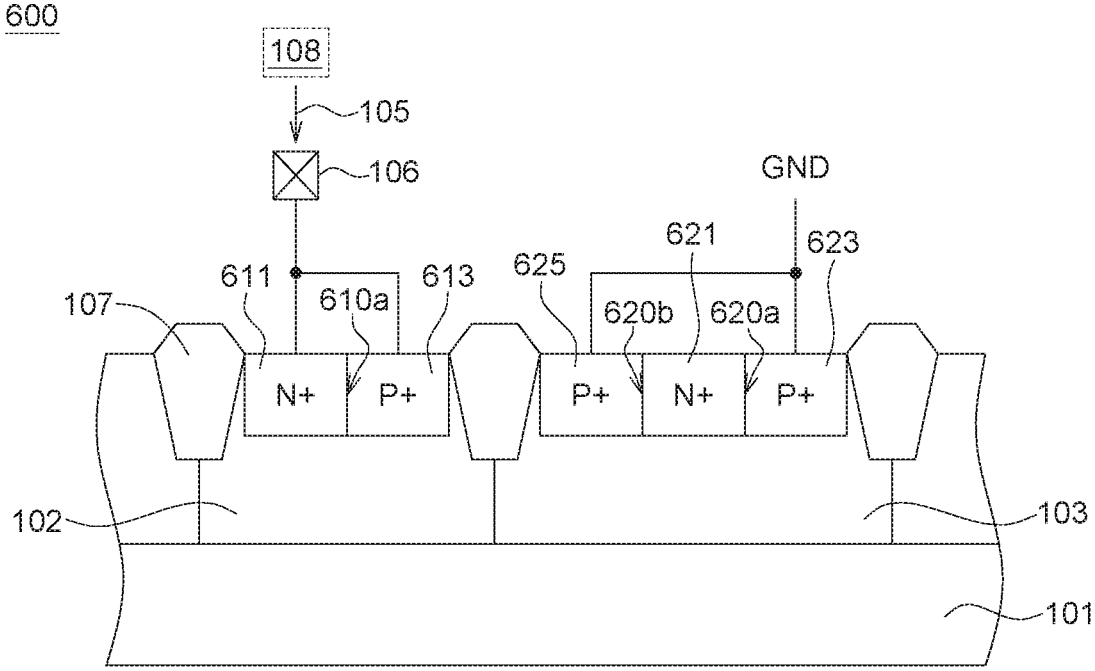
FIG. 6 is a cross-sectional view of an ESD protection apparatus in accordance with a further embodiment of the present disclosure.

FIG. 6 is a cross-sectional view illustrating an ESD protection apparatus 600 in accordance with a further embodiment of the present disclosure. The structure of the ESD protection apparatus 600 is similar to that of the ESD protection apparatus 100 depicted in FIG. 1, except that the third doping region 621 and the fourth doping region 623 are directly connected and contacting together to form a p-n junction 620a, and a fifth doping region 625 is disposed in the second well 103 and connected to the third doping region 621 to form a p-n junction 620b. Both of the first doping region 611 and the second doping region 613 are electrically connected to the pad 106 by, for example, metal lines. No metal line is connected to the third doping region 621, and the third doping region 621 is in a floating state. Both of the fourth doping region 623 and the fifth doping region 625 are electrically connected to the ground GND by, for example, metal lines. The fifth doping region 625 having p-type conductivity has a doping concentration substantially greater than that of the second well 103 (also referred to as P+). For example, the fifth doping region 625 may have a doping concentration of $10^{15}/cm^2$. The first doping region 611, the second doping region 613, the third doping region 621 and the fourth doping region 623 are similar to the first doping region 111, the second doping region 113, the third doping region 121 and the fourth doping region 123, respectively.

In the ESD protection apparatus 600, three P+/N+ junctions are formed by the first doping region 611 and the second doping region 613 (p-n junction 610a), formed by the third doping region 621 and the fourth doping region 623 (p-n junction 620a), and formed by the third doping region 621 and the fifth doping region 625 (p-n junction 620b).

When the internal circuit 108 is subjected to an ESD stress, the ESD current flows into the ESD protection apparatus 600 having the parasite SCR from the pad 106 and passes through the second doping region 613, and then flows to the third doping region 621. The third doping region 621 may be maintained in a floating state. Then, the ESD current tunnels to the fourth doping region 623 and the fifth doping region 625 from the third doping region 621 by respectively penetrating the p-n junction 620a and the p-n junction 620b, and is directed into the ground GND via the fourth doping region 623 and the fifth doping region 625.

Since thee P+/N+ junctions (p-n junctions 620a and 620b) are formed in the ESD protection apparatus (ESD protection apparatus 600), the effective path between anode and the cathode is lengthened comparing to a comparative example having no p-n junction formed by the doping regions, thus the holding voltage of the parasitic SCR in the ESD protection apparatus can be significantly increased. As a result, the EOS or latch up risk can be moderated.

Figure 7:
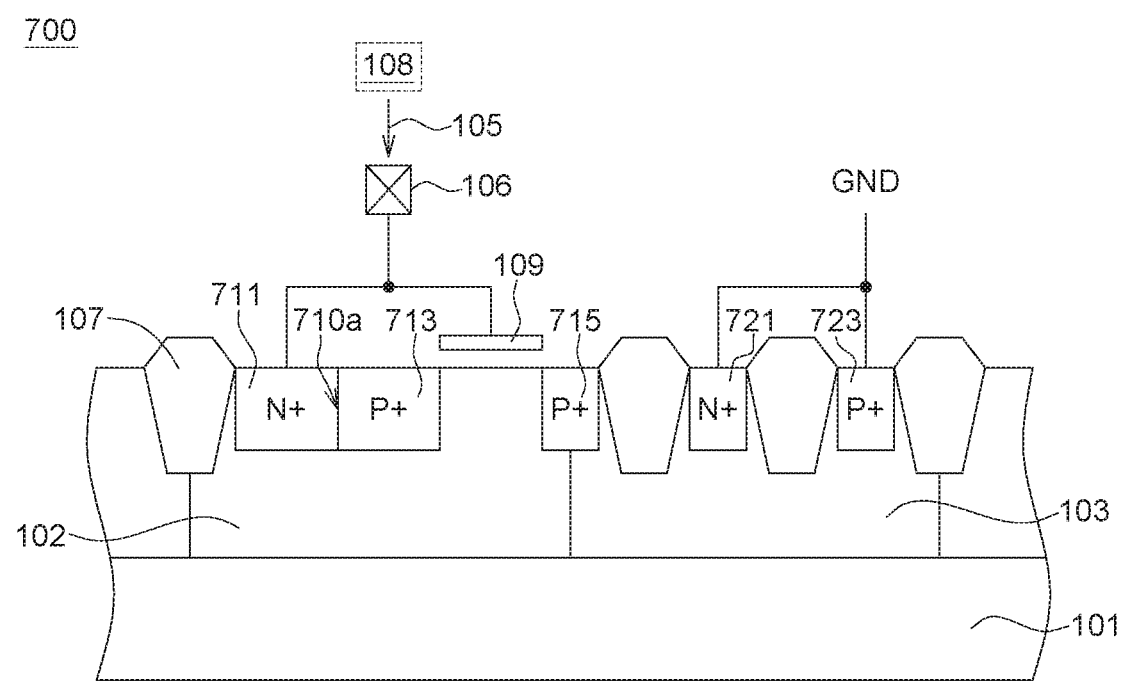
FIG. 7 is a cross-sectional view of an ESD protection apparatus in accordance with a further embodiment of the present disclosure.

FIG. 7 is a cross-sectional view illustrating an ESD protection apparatus 700 in accordance with a further embodiment of the present disclosure. The structure of the ESD protection apparatus 700 is similar to that of the ESD protection apparatus 100 depicted in FIG. 1, except that a MOS structure is included and a fifth doping region 715 is disposed between the second doping region 713 and the third doping region 721.

The fifth doping region 715 has p-type conductivity. A portion of the fifth doping region 715 is disposed in the first well 102 and the other portion of the fifth doping region 715 is disposed in the second well 103. The fifth doping region 715 has a doping concentration substantially greater than that of the first well 102 and the second well 103 (also referred to as P+). For example, the fifth doping region 715 may have a doping concentration of $10^{15}/cm^2$. The first doping region 711, the second doping region 713, the third doping region 721 and the fourth doping region 723 are similar to the first doping region 111, the second doping region 113, the third doping region 121 and the fourth doping region 123, respectively.

In the ESD protection apparatus 700, one P+/N+ junction is formed by the first doping region 711 and the second doping region 713 (p-n junction 710a). Both of the first doping region 711 and a gate 109 of the MOS structure are electrically connected to the pad 106 by, for example, metal lines. No metal line is connected to the second doping region 713, and the second doping region 713 is in a floating state. Both of the third doping region 721 and the fourth doping region 723 are electrically connected to the ground GND by, for example, metal lines.

In the present embodiment, the ESD protection apparatus 700 includes the PMOS structure, and is implemented as a PMOS low voltage triggering SCR (PMOS LVTSCR). In other embodiments, the ESD protection apparatus may include an NMOS structure.

When the internal circuit 108 is subjected to an ESD stress, the second doping region 713 may be remained in a floating state, the ESD current flows into the ESD protection apparatus 700 having the parasite SCR from the pad 106 and passes through the first doping region 711. Then, the ESD current tunnels to the second doping region 713 from the first doping region 711 by penetrating the p-n junction 710a, and then flows to the third doping region 721 and is directed into the ground GND via the third doping region 721.

Since one P+/N+ junction (p-n junction 710a) is formed in the ESD protection apparatus (ESD protection apparatus 700), the effective path between the anode and the cathode is lengthened comparing to a comparative example having no p-n junction formed by the doping regions, thus the holding voltage of the parasitic SCR in the ESD protection apparatus can be significantly increased. As a result, the EOS or latch up risk can be moderated.

In accordance with the aforementioned embodiments of the present disclosure, an ESD protection apparatus and applications thereof are provided. The ESD protection apparatus includes at least four doping regions respectively disposed in two doping wells having different conductivities, and at least one junction formed by different conductivities is formed by the first doping region and the second doping region, or formed by the third doping region and the fourth doping region. The doping wells and doping regions are integrated to form a NPN parasitic BJT and a PNP parasitic BJT as well as to configure a parasitic SCR. One of the doping regions is used to form the anode (or the cathode).

Because the parasitic SCR within the ESD protection apparatus has at least one P+/N+ junction formed between the anode and the cathode, the ESD current needs to penetrate through the at least one P+/N+ junction by the tunneling effect, so that the current path between the anode and the cathode are lengthened comparing to a comparative example having no p-n junction formed by the doping regions. Thus, the holding voltage of the parasitic SCR in the ESD protection apparatus can be significantly increased, the EOS or latch up risk can be moderated, and the performance of the ESD protection apparatus can be improved.

While the disclosure has been described by way of example and in terms of the exemplary embodiment(s), it is to be understood that the disclosure is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. An electrostatic discharge (ESD) protection apparatus, comprising:
   a semiconductor substrate;
   a first well having a first conductivity, disposed in the semiconductor substrate;
   a second well having a second conductivity, disposed in the semiconductor substrate;
   a first doping region having the first conductivity and disposed in the first well;
   a second doping region having the second conductivity and disposed in the first well;
   a third doping region having the first conductivity, disposed in the second well;
   a fourth doping region having the second conductivity, disposed in the second well;
   a first junction formed by the first doping region and the second doping region; and
   a second junction formed by the third doping region and the fourth doping region,
   wherein at least one of the first doping region, the second doping region, the third doping region and the fourth doping region is in a floating state, ESD current flows through the at least one of the first doping region, the second doping region, the third doping region and the fourth doping region in the floating state.

2. The ESD protection apparatus according to claim 1, wherein the second doping region, the first well and the second well are integrated to form a first parasitic bipolar junction transistor (BJT); the first well, the third doping region and the second well are integrated to form a second parasitic BJT; and the first parasitic BJT and the second parasitic BJT have different majority carriers.

3. The ESD protection apparatus according to claim 1, wherein the first conductivity is n-type conductivity, and the second conductivity is p-type conductivity; the first doping region is connected to a voltage source, and the fourth doping region is connected to a ground.

4. The ESD protection apparatus according to claim 3, wherein the second doping region is in the floating state, and the third doping region is connected to the ground.

5. The ESD protection apparatus according to claim 4, further comprising a fifth doping region, having the first conductivity and disposed in the first well, and connected to the second doping region.

6. The ESD protection apparatus according to claim 4, further comprising a fifth doping region, having the second conductivity and disposed between the second doping region and the third doping region.

7. The ESD protection apparatus according to claim 6, wherein a portion of the fifth doping region is disposed in the first well and the other portion of the fifth doping region is disposed in the second well.

8. The ESD protection apparatus according to claim 3, wherein the second doping region is connected to the voltage source, and the third doping region is in the floating state.

9. The ESD protection apparatus according to claim 8, further comprising a fifth doping region, having the second conductivity and disposed in the second well, and connected to the third doping region.

10. A method for operating an ESD protection apparatus, comprising:
    providing an ESD protection apparatus electrically connected to an internal circuit, the ESD protection apparatus comprising:
    a semiconductor substrate;
    a first well having a first conductivity, disposed in the semiconductor substrate;
    a second well having a second conductivity, disposed in the semiconductor substrate;
    a first doping region having the first conductivity and disposed in the first well;
    a second doping region having the second conductivity and disposed in the first well;
    a third doping region having the first conductivity, disposed in the second well;
    a fourth doping region having the second conductivity, disposed in the second well;
    a first junction formed by the first doping region and the second doping region; and
    a second junction formed by the third doping region and the fourth doping region,
    wherein at least one of the first doping region, the second doping region, the third doping region and the fourth doping region is in a floating state,
    when the internal circuit is subjected to an ESD stress, directing ESD current to a ground by the ESD protection apparatus through the at least one of the first doping region, the second doping region, the third doping region and the fourth doping region in the floating state, the first junction and the second junction.

11. The method according to claim 10, wherein the second doping region, the first well and the second well are integrated to form a first parasitic bipolar junction transistor (BJT); the first well, the third doping region and the second well are integrated to form a second parasitic BJT; and the first parasitic BJT and the second parasitic BJT have different majority carriers.

12. The method according to claim 10, wherein the first conductivity is n-type conductivity, and the second conductivity is p-type conductivity; the ESD current flows into the ESD protection apparatus through the first doping region, and is directed into the ground via the third doping region.

13. The method according to claim 10, further comprising remaining the second doping region in the floating state, when the internal circuit is subjected to the ESD stress.

14. The method according to claim 12, wherein the ESD protection apparatus further comprises a fifth doping region having the second conductivity disposed between the second doping region and the third doping region.

15. The method according to claim 14, wherein a portion of the fifth doping region is disposed in the first well and the other portion of the fifth doping region is disposed in the second well.

16. The method according to claim 10, wherein the first conductivity is n-type conductivity, and the second conductivity is p-type conductivity; the ESD current flows into the ESD protection apparatus through the second doping region, and is directed into the ground via the fourth doping region.

17. The method according to claim 10, further comprising remaining the third doping region in the floating state, when the internal circuit is subjected to the ESD stress.

* * * * *